(12) United States Patent
Weintraub et al.

(10) Patent No.: US 7,208,383 B1
(45) Date of Patent: Apr. 24, 2007

(54) METHOD OF MANUFACTURING A SEMICONDUCTOR COMPONENT

(75) Inventors: Chad Weintraub, Dresden (DE);
James F. Buller, Austin, TX (US);
Derick Wristers, Bee Cave, TX (US);
Jon Cheek, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 140 days.

(21) Appl. No.: 10/284,651

(22) Filed: Oct. 30, 2002

(51) Int. Cl.
*H01L 21/336* (2006.01)

(52) U.S. Cl. ............... 438/302; 438/306; 257/E21.345; 257/E21.427

(58) Field of Classification Search ................ 438/286, 438/302, 306, 301
See application file for complete search history.

(56) References Cited

U.S. PATENT DOCUMENTS

| | | | |
|---|---|---|---|
| 4,613,882 A * | 9/1986 | Pimbley et al. ............. 257/336 |
| 5,237,193 A | 8/1993 | Williams et al. |
| 5,270,226 A | 12/1993 | Hori et al. |
| 5,432,106 A | 7/1995 | Hong |
| 5,510,280 A | 4/1996 | Noda |
| 5,650,340 A | 7/1997 | Burr et al. |
| 5,670,389 A | 9/1997 | Huang et al. |
| 5,830,788 A * | 11/1998 | Hiroki et al. ............... 438/199 |
| 5,851,886 A | 12/1998 | Peng |
| 5,869,378 A | 2/1999 | Michael |
| 5,891,774 A | 4/1999 | Ueda et al. |
| 5,909,622 A | 6/1999 | Kadosh et al. |
| 5,925,914 A | 7/1999 | Jiang et al. |
| 5,935,867 A * | 8/1999 | Alvis et al. .................. 438/302 |
| 6,008,094 A | 12/1999 | Krivokapic et al. |
| 6,008,099 A | 12/1999 | Sultan et al. |
| 6,020,611 A | 2/2000 | Ma et al. |
| 6,103,563 A | 8/2000 | Lukanc et al. |
| 6,140,186 A | 10/2000 | Lin et al. |
| 6,168,637 B1 | 1/2001 | Randolph et al. |
| 6,190,980 B1 | 2/2001 | Yu et al. |
| 6,200,864 B1 | 3/2001 | Selcuk |
| 6,218,224 B1 | 4/2001 | Lukanc et al. |
| 6,242,329 B1 | 6/2001 | Huster et al. |
| 6,255,174 B1 * | 7/2001 | Yu .............................. 438/286 |
| 6,268,253 B1 | 7/2001 | Yu |

(Continued)

OTHER PUBLICATIONS

High Performance Logic and High-Gain Analog CMOS Transistors Formed by a Shadow-Mask Technique With a Single Implant Step, Hook, Terence B., et al., IEEE Transactions on Electron Devices, vol. 49, No. 9, Sep. 2002.

*Primary Examiner*—Alexander Ghyka
(74) *Attorney, Agent, or Firm*—Farjami & Farjami LLP

(57) ABSTRACT

An insulated gate field effect transistor having reduced gate-drain overlap and a method for manufacturing the insulated gate field effect transistor. A gate structure is formed on a major surface of a semiconductor substrate. A source extension region and a drain extension region are formed in a semiconductor material using an angled implant. The source extension region extends under the gate structure, whereas the drain extension region is laterally spaced apart from the gate structure. A source region is formed in the semiconductor substrate and a drain region is formed in the semiconductor substrate, where the source and drain regions are laterally spaced apart from the gate structure. A source-side halo region is formed in the semiconductor substrate adjacent the source extension region.

20 Claims, 4 Drawing Sheets

U.S. PATENT DOCUMENTS

| | | |
|---|---|---|
| 6,291,325 B1 | 9/2001 | Hsu |
| 6,297,098 B1 * | 10/2001 | Lin et al. .................... 438/264 |
| 6,344,396 B1 | 2/2002 | Ishida et al. |
| 6,372,587 B1 | 4/2002 | Cheek et al. |
| 6,373,103 B1 | 4/2002 | Long et al. |
| 6,391,728 B1 | 5/2002 | Yu |
| 6,396,103 B1 | 5/2002 | Riccobene et al. |
| 6,399,452 B1 | 6/2002 | Krishnan et al. |
| 6,406,957 B1 | 6/2002 | Wu et al. |
| 6,465,315 B1 * | 10/2002 | Yu ............................. 438/306 |
| 2001/0019869 A1 | 9/2001 | Hsu |
| 2001/0024847 A1 | 9/2001 | Snyder |

* cited by examiner

-PRIOR ART-

METHOD OF MANUFACTURING A SEMICONDUCTOR COMPONENT

FIELD OF THE INVENTION

This invention relates, in general, to semiconductor components and, more particularly, to overlap of an extension region and a gate edge of a semiconductor component.

BACKGROUND OF THE INVENTION

Integrated circuits such as microprocessors, digital signal processors, microcontrollers, memory devices, and the like typically contain millions of Insulated Gate Field Effect Transistors (IGFET's). Because of the desire to lower manufacturing costs and increase circuit speed, integrated circuit manufacturers shrink the sizes of the IGFET's making up an integrated circuit so that more integrated circuits can be manufactured from a single semiconductor wafer. Although the smaller transistors are capable of operating at increased speeds, secondary performance factors such as decreased source-drain breakdown voltage, increased gate current, and instability of the threshold voltage negatively impact transistor performance. Collectively, these adverse performance effects are referred to as short channel effects.

Typical techniques for mitigating short channel effects rely on adjusting the electric field in the channel region to minimize the peak lateral electric field of the drain depletion region. One technique for lowering the lateral electric field is to include source and drain extension regions in the transistor. FIG. 1 is a cross-sectional side view of a transistor 10 having source and drain extension regions. What is shown in FIG. 1 is a cross-sectional view of transistor 10 comprising a silicon substrate 12 having a major surface 14 and a gate structure 16 disposed thereon. Gate structure 16 has opposing sides 22 and 24 and is comprised of a gate conductor 20 stacked on a gate oxide 18. A source extension region 26 extends into silicon substrate 12 and under gate structure 16 and a drain extension region 28 extends into silicon substrate 12 and under gate structure 16. Spacers 32 and 34 are formed along sides 22 and 24 of gate structure 16. Source and drain regions 36 and 38 extend into silicon substrate 12 and are laterally spaced apart from gate structure 16. The drain extension region reduces the maximum electric field in the drain region of transistor 10, thereby reducing the number of hot carriers injected into gate oxide 18. Although the reduction in hot carriers into gate oxide 18 is beneficial, thin gate oxides used in present day high performance CMOS devices still result in high gate-to-drain tunneling current that decreases the performance of the transistor and, thus, the circuits that incorporate the transistors.

Accordingly, what is needed is a semiconductor component having a lowered gate-to-drain tunneling current and a method for manufacturing the semiconductor component.

SUMMARY OF THE INVENTION

The present invention satisfies the foregoing need by providing a semiconductor component and a method for manufacturing the semiconductor component having source and drain extension regions that are asymmetric about a gate structure. In accordance with one aspect, the present invention comprises a method for manufacturing the semiconductor component wherein a gate structure is formed on a semiconductor material of the first conductivity type. A dopant of the second conductivity type is implanted into the semiconductor material and the gate structure at an angle of less than 90 degrees with respect to a direction normal to a major surface of the semiconductor material. After implantation, a portion of the dopant is in the semiconductor material adjacent to and extending under the gate structure and another portion of the dopant is laterally spaced apart from the gate structure. Spacers are formed adjacent opposing sides of the gate structure and a source/drain implantation is performed to form source and drain regions. Optionally, a source-side halo region is formed in the semiconductor material by implanting a dopant of the first conductivity type into the portion of the semiconductor material adjacent the source extension region.

In accordance with another aspect, the present invention comprises an insulated gate field effect transistor comprising a semiconductor substrate having a gate structure formed thereon. A source extension region is adjacent the first side of the gate structure and extends under the gate structure and a drain extension region is adjacent the second side of the gate structure and is laterally spaced apart from the gate structure. A source region is adjacent to and spaced apart from the first side of the gate structure and a drain region is adjacent to and spaced apart from the second side of the gate structure. Optionally, a source-side halo region is adjacent the source extension region.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a semiconductor component such as an insulated gate semiconductor device or field effect transistor and a method for manufacturing the semiconductor component. In accordance with an embodiment of the present invention, asymmetric source/drain extensions are formed using an angled implant. The use of an asymmetric implant provides overlap between the source extension region and the gate structure and decreases the overlap between the drain extension region and the gate structure. The source extension region-gate structure overlap reduces the source-drain resistance of the transistor. The reduced overlap between the drain extension region and the gate structure decreases the gate-to-drain tunneling current. In addition, the angled implant allows formation of the source and drain extension regions without the need for costly masking steps. In accordance with another embodiment, a source-side halo region is included that provides for high carrier mobility and stabilizes the threshold voltage, i.e., improves the threshold voltage roll-off.

Figure 1:
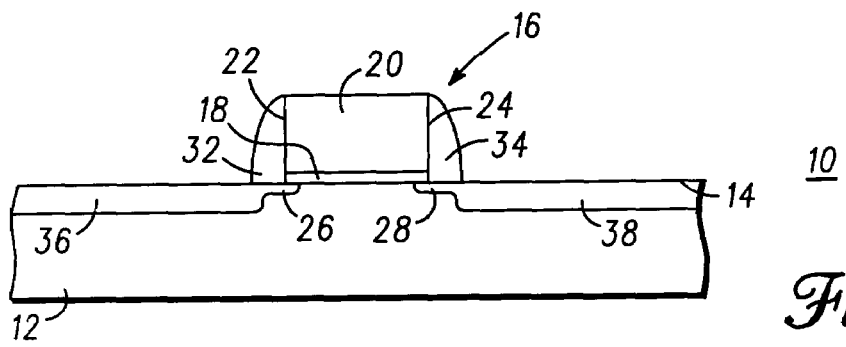
FIG. 1 is a highly enlarged cross-sectional view of a prior art insulated gate field effect transistor.
Figure 2:
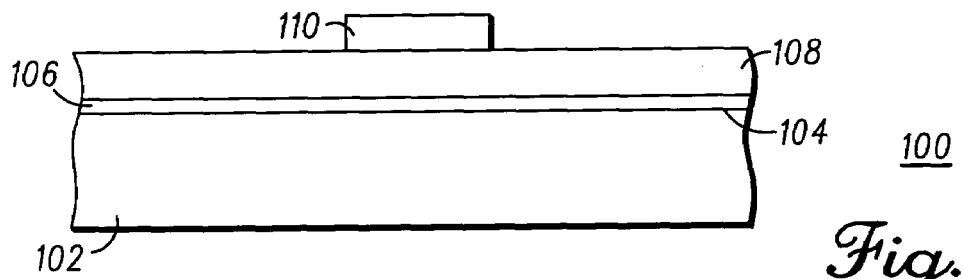
FIGS. 2–7 are highly enlarged cross-sectional views of a portion of an insulated gate field effect transistor in accordance with an embodiment of the present invention.

FIG. 2 is an enlarged cross-sectional view of a portion of a partially completed insulated gate field effect transistor 100 during beginning processing steps in accordance with an embodiment of the present invention. What is shown in FIG.

2 is a semiconductor substrate 102 of P-type conductivity having a major surface 104. By way of example, semiconductor substrate 102 is silicon having a <100> crystal orientation and a P-type dopant concentration on the order of $1\times10^{16}$ ions per cubic centimeter (ions/cm$^3$). Alternatively, semiconductor substrate 102 may be comprised of a heavily doped silicon wafer having a <100> crystal orientation and a lightly doped epitaxial layer disposed thereon. Other suitable materials for substrate 102 include silicon germanium, germanium, Silicon-On-Insulator (SOI), and the like. The conductivity type of substrate 102 is not a limitation of the present invention. In accordance with the present embodiment, the conductivity type is chosen to form an N-channel insulated gate field effect transistor. However, the conductivity type of the silicon wafer can be selected to form a P-channel insulated gate field effect transistor or a complementary insulated gate field effect transistor, e.g., a Complementary Metal Oxide Semiconductor (CMOS) transistor. In addition, dopant wells such as an N-well in a substrate of P-type conductivity or a P-well in a substrate of N-type conductivity can be formed in substrate 102. The P-channel and N-channel transistors are formed in the respective dopant wells. Although not shown, it should be understood that a threshold voltage adjust implant may be performed in semiconductor substrate 102 or in the dopant wells.

A layer of dielectric material 106 is formed on major surface 104. Dielectric layer 106 serves as a gate dielectric material and may be formed by techniques known to those skilled in the art including thermal oxidation, chemical vapor deposition, and the like. Layer 106 has a thickness ranging from approximately 15 Angstroms (Å) to approximately 100 Å. A layer of polysilicon 108 is formed on dielectric layer 106 using, for example, a chemical vapor deposition technique. A suitable range of thicknesses for polysilicon layer 108 is between approximately 500 Å and approximately 2,000 Å. By way of example, dielectric layer 106 has a thickness of 200 Å and polysilicon layer 108 has a thickness of 1,500 Å. A layer of photoresist is deposited on polysilicon layer 108 and patterned to form an etch mask 110. Techniques for depositing and patterning photoresist are well known to those skilled in the art.

Figure 3:
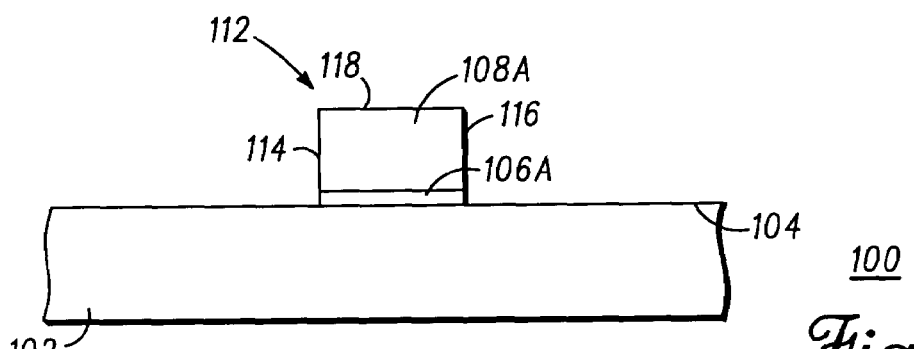

Referring now to FIG. 3, polysilicon layer 108 is etched using an etch chemistry that preferentially etches polysilicon and not the underlying dielectric material. By way of example, polysilicon layer 108 is etched using anisotropic Reactive Ion Etching (RIE) and an etchant species that preferentially etches polysilicon. Methods for etching polysilicon are well known to those skilled in the art. After removal of the exposed portions of polysilicon layer 108, the etch chemistry is changed to anisotropically etch oxide layer 106. The anisotropic etching of oxide layer 106 stops at major surface 104. Then etch mask layer 110 is removed. The remaining portions 108A and 106A of polysilicon layer 108 and dielectric layer 106, respectively, form a gate structure 112 having sides 114 and 116 and a top surface 118. Portion 108A serves as a gate conductor and portion 106A serves as a gate oxide.

Figure 4:
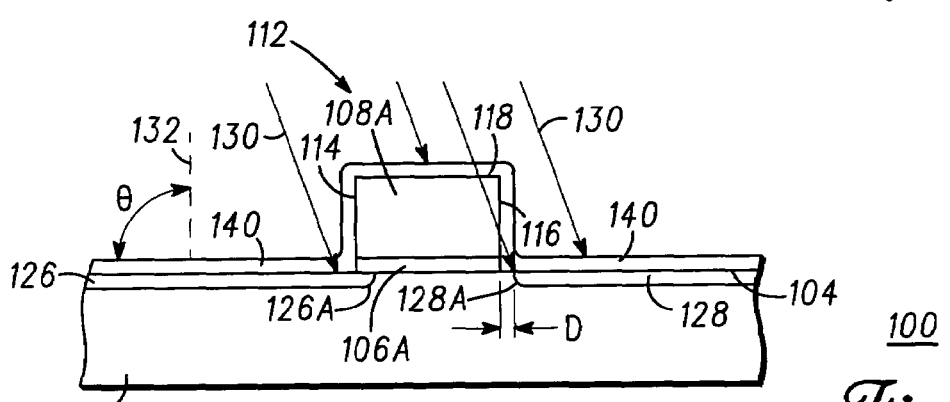

Referring now to FIG. 4, a dopant of N-type conductivity such as, for example, arsenic is implanted into semiconductor material 102 to form doped regions 126 and 128. Portions 126A and 128A of doped regions 126 and 128 serve as source and drain extension regions, respectively. Preferably, the implant is an angled or tilted implant which makes an angle θ with respect to a direction (indicated by broken line 132) substantially perpendicular (or normal) to major surface 104, wherein angle θ is less than 90 degrees and preferably ranges from approximately 0 degrees to approximately 20 degrees. Even more preferably, angle θ ranges between approximately 0 degrees and approximately 10 degrees. A suitable set of parameters for the source and drain extension implant includes implanting the dopant of N-type conductivity such as, for example, arsenic at a dose ranging between approximately $1\times10^{14}$ ions per square centimeter (ions/cm$^2$) and approximately $1\times10^{16}$ ions/cm$^2$ and using an implant energy ranging between approximately 100 electron Volts (eV) and approximately 20 (kilo electron Volts) keV. The angled dopant implantation is represented by arrows 130. The energy and dose are exemplary values and are not limitations of the present invention. The implant can be annealed using a rapid thermal anneal (RTA) process or a conventional furnace anneal process. By way of example, semiconductor device 100 is annealed by heating to a temperature ranging between approximately 800 degrees Celsius (° C.) and approximately 1,100° C. Annealing semiconductor component 100 causes the dopant to diffuse in both the vertical and lateral directions. Thus, the N-type dopant diffuses under gate structure 112 from side 114 and towards side 116 of gate structure 112.

Because source and drain extension regions 126A and 128A, respectively, are formed using a tilt angle implant, they are asymmetric about gate structure 112. Source extension region 126A extends into semiconductor substrate 102 and under gate structure 112 from side 114, whereas drain extension region 128A extends into semiconductor substrate 102 and is laterally spaced apart from side 116 of gate structure 112. Thus, drain extension region 128A does not extend under gate structure 112. The distance, D, between drain extension region 128A and side 116 of gate structure 112 is dependent, in part, upon the implantation angle and the height of gate structure 112. For example, when gate structure 112 has a height of about 1,500 Å, drain extension region 128A is about 40 Å from side 116 when implantation angle θ is about 10 degrees, whereas drain extension region 128A is about 80 Å from side 116 when implantation angle θ is about 20 degrees. In addition, the anneal process affects the distance between drain extension region 128A and side 116. The higher the anneal temperature and the longer the anneal, the closer drain extension region 128A diffuses towards side 116.

Still referring to FIG. 4, a silicon nitride layer 140 is deposited on gate structure 112 and the exposed portions of major surface 104. By way of example, silicon nitride layer 140 is deposited using a chemical vapor deposition technique. Preferably, silicon nitride layer 140 has a thickness ranging between approximately 600 Å and approximately 1,500 Å. Alternatively, layer 140 can be an oxide layer or a layer of any material suitable for forming spacers.

Figure 5:
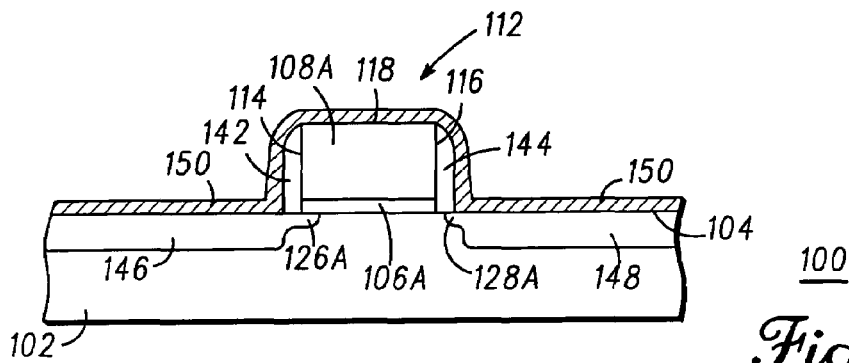

Referring now to FIG. 5, silicon nitride layer 140 is anisotropically etched to form spacers 142 and 144 and to expose surface 104 of semiconductor substrate 102. A source/drain implant is performed to form a source region 146 and a drain region 148. The source/drain implant also dopes gate structure 112. A suitable set of parameters for the source/drain implant includes implanting a dopant of N-type conductivity such as, for example, phosphorus at a dose ranging between approximately $1\times10^{14}$ ions/cm$^2$ and approximately $1\times10^{16}$ ions/cm$^2$ and using an implant energy ranging between approximately 5 keV and approximately 100 keV. The doped semiconductor material is annealed by heating to a temperature between approximately 800° C. and 1,100° C. Preferably, source and drain regions 146 and 148 are formed using a zero degree implant.

Still referring to FIG. 5, an optional wet etch is performed to remove any oxide along top surface 118 of gate conductor 108A and any oxide layer disposed on major surface 104. A layer of refractory metal 150 is deposited on top surface 118, spacers 142 and 144, and the exposed portions of silicon surface 14. By way of example, refractory metal layer 150 is cobalt having a thickness ranging between approximately 50 Å and approximately 300 Å.

Figure 6:
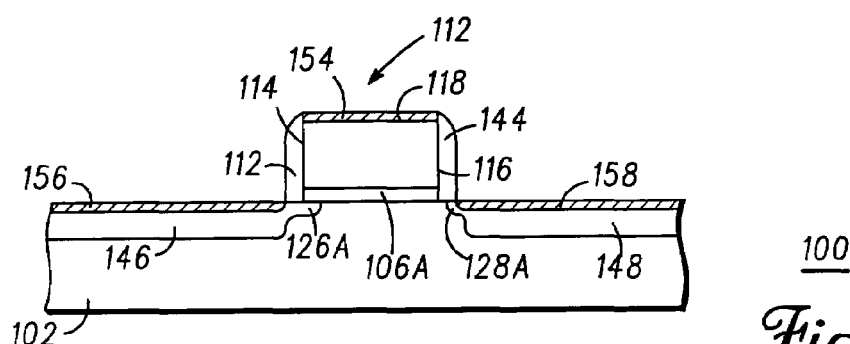

Referring now to FIG. 6, refractory metal layer 150 is heated to a temperature ranging between 600° C. and 700° C. The heat treatment causes the cobalt to react with the silicon to form cobalt silicide ($CoSi_2$) in all regions in which the cobalt is in contact with silicon. Thus, cobalt silicide 154 is formed from gate conductor 108A, cobalt silicide 156 is formed from source region 146, and cobalt silicide 158 is formed from drain region 148. The portions of the cobalt disposed on spacers 142 and 144 remain unreacted. It should be understood that the type of silicide is not a limitation of the present invention. For example, other suitable silicides include titanium silicide (TiSi), platinum silicide (PtSi), nickel silicide (NiSi), and the like. As those skilled in the art are aware, silicon is consumed during the formation of silicide and the amount of silicon consumed is a function of the type of silicide being formed. Thus, silicide 154 is shown extending into gate conductor 108A, silicide 156 is shown extending into source region 146, and silicide 158 is shown extending into drain region 148.

Still referring to FIG. 6, the unreacted cobalt is removed using processes known to those skilled in the art. Removing the unreacted cobalt electrically isolates gate conductor 108A, source region 146, and drain region 148 from each other.

Figure 7:
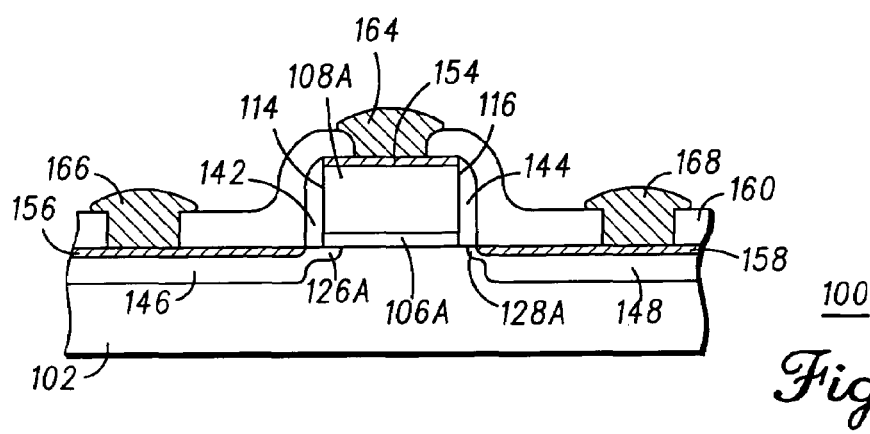

Referring now to FIG. 7, a layer of dielectric material 160 is formed on the silicided regions and the spacers. By way of example, dielectric material 160 is oxide having a thickness ranging between approximately 5,000 Å and approximately 15,000 Å. Openings are formed in oxide layer 160 to expose portions of silicide layers 154, 156, and 158. Using techniques well known to those skilled in the art, electrical conductors or electrodes are formed which contact the exposed portions of silicide layers 154, 156, and 158. More particularly, a gate electrode 164 contacts gate silicide 154, a source electrode 166 contacts source silicide layer 156, and a drain electrode 168 contacts drain silicide layer 158. Accordingly, a semiconductor component 100 and a method for manufacturing the semiconductor component have been provided wherein a gate structure overlaps a source extension region but does not overlap a drain extension region.

Figure 8:
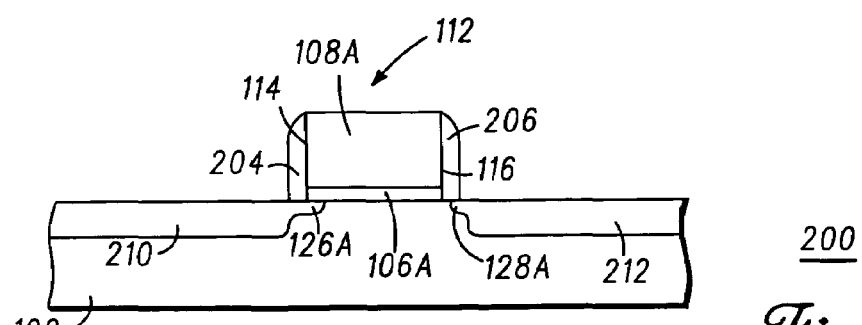
FIGS. 8–13 are highly enlarged cross-sectional views of a portion of an insulated gate field effect transistor in accordance with another embodiment of the present invention.

FIG. 8 is an enlarged cross-sectional view of a portion of a partially completed insulated gate field effect transistor 200 during processing in accordance with another embodiment of the present invention. It should be understood that the beginning processing steps in the manufacture of semiconductor component 200 are the same as those described with reference to FIGS. 1–4. Accordingly, in the present embodiment FIG. 8 continues from FIG. 4. What is shown in FIG. 8 is a silicon nitride layer 140 that has been anisotropically etched to form disposable spacers 204 and 206 and to expose surface 104 of semiconductor substrate 102.

A source/drain implant is performed to form a source region 210 and a drain region 212 into semiconductor material 102. The source/drain implant also dopes gate structure 112. A suitable set of parameters for the source/drain implant includes implanting a dopant of N-type conductivity such as, for example, phosphorus at a dose ranging between approximately $1\times10^{14}$ ions/cm$^2$ and approximately $1\times10^{16}$ ions/cm$^2$ and using an implant energy ranging between approximately 5 keV and approximately 100 keV. The doped semiconductor material is annealed by heating to a temperature between approximately 800° C. and 1,100° C. Preferably, the respective source and drain regions 210 and 212 are formed using a zero degree implant.

Figure 9:
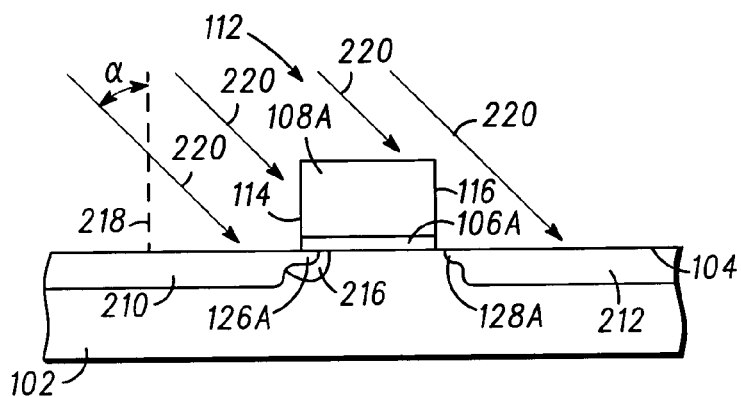

Referring now to FIG. 9, disposable spacers 204 and 206 are removed using either a wet etch or a dry etch that is suitable for removing silicon nitride. A dopant of P-type conductivity such as, for example, boron or indium, is implanted into semiconductor material 102 to form doped region 216. Doped region 216 is referred to as a source-side halo region. Preferably, the implant is an angled or tilt angle implant which makes an angle $\alpha$ with respect to a direction (indicated by broken line 218) substantially perpendicular to major surface 104, wherein angle $\alpha$ ranges between approximately 25 degrees and approximately 65 degrees. More preferably, angle $\alpha$ ranges between 35 degrees and 45 degrees. By way of example, the dose of the implant may range from approximately $5\times10^{12}$ ions/cm$^2$ to approximately $1\times10^{15}$ ions/cm$^2$. An implant energy may range from approximately 5 keV to approximately 70 keV. The angled dopant implantation is represented by arrows 220. It should be noted that although the implantation forming doped region 216 also dopes the source and drain regions, it does not significantly change the dopant concentrations of the source and drain regions. Thus, the reference numbers identifying the source and drain regions have not been changed.

Figure 10:
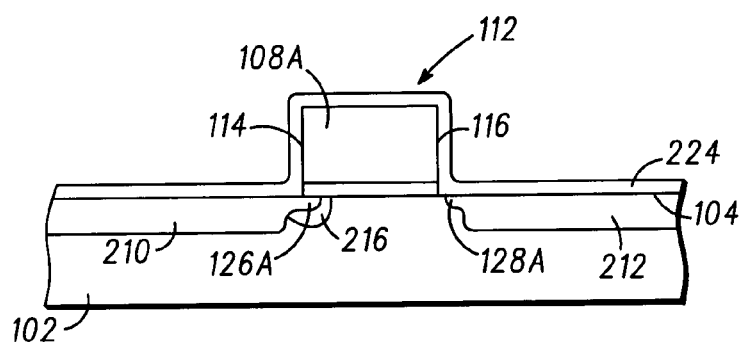

Referring now to FIG. 10, a silicon nitride layer 224 is deposited on gate structure 112 and the exposed portions of major surface 104. By way of example, silicon nitride layer 224 is deposited using a chemical vapor deposition technique. Preferably, silicon nitride layer 224 has a thickness ranging between approximately 600 Å and approximately 1,500 Å. Alternatively, layer 224 can be an oxide layer or a layer of any material suitable for forming spacers.

Figure 11:
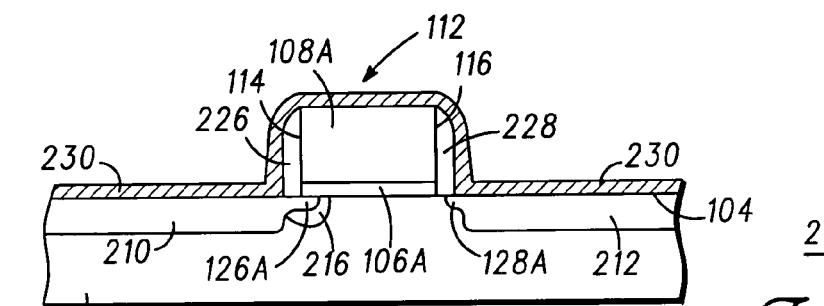

Referring now to FIG. 11, silicon nitride layer 224 is anisotropically etched to form spacers 226 and 228 and to expose surface 104 of semiconductor substrate 102. By way of example, silicon nitride layer 224 is anisotropically etched using a Reactive Ion Etch. A layer of refractory metal 230 is conformally deposited on top surface 118, spacers 226 and 228, and the exposed portions of silicon surface 104. By way of example, the metal of refractory metal layer 230 is cobalt having a thickness ranging between approximately 50 Å and approximately 300 Å.

Figure 12:
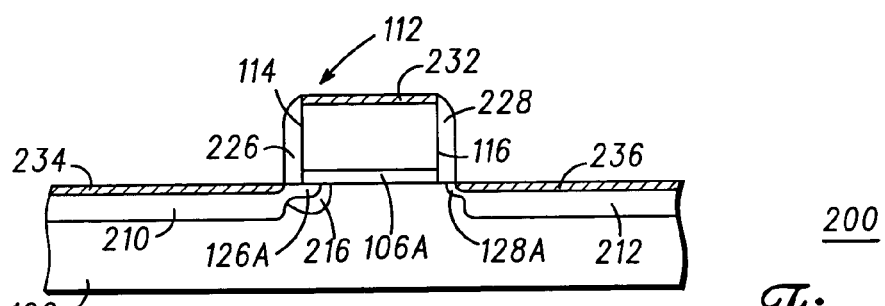

Referring now to FIG. 12, refractory metal layer 230 is heated to a temperature ranging between 600° C. and 700° C. The heat treatment causes the cobalt to react with the silicon to form cobalt silicide ($CoSi_2$) in all regions in which the cobalt is in contact with silicon. Thus, cobalt silicide 232 is formed from gate conductor 108A, cobalt silicide 234 is formed from source region 210, and cobalt silicide 236 is formed from drain region 212. The portions of the cobalt disposed on spacers 226 and 228 remain unreacted. It should be understood that the type of silicide is not a limitation of the present invention. For example, other suitable silicides include titanium silicide (TiSi), platinum silicide (PtSi), nickel silicide (NiSi), and the like. As those skilled in the art are aware, silicon is consumed during the formation of silicide and the amount of silicon consumed is a function of the type of silicide being formed. Thus, silicide 232 is shown extending into gate conductor 108A, silicide 234 is shown extending into source region 210, and silicide 236 is shown extending into drain region 212.

Still referring to FIG. 12, the unreacted cobalt is removed using processes known to those skilled in the art. Removing the unreacted cobalt electrically isolates gate conductor 108A, source region 210, and drain region 212 from each other.

Figure 13:
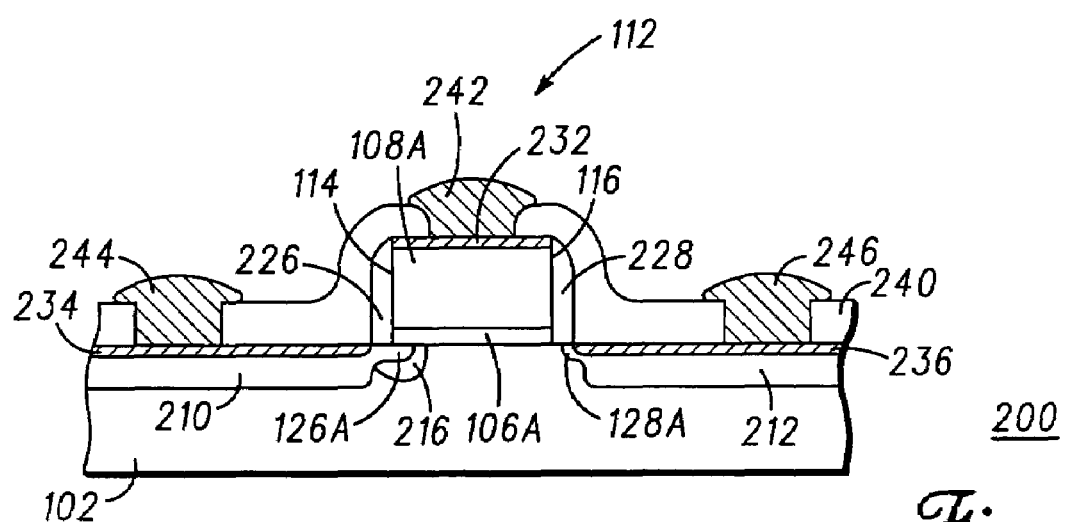

Referring now to FIG. 13, a layer of dielectric material 240 is formed on the silicided regions and the spacers. By way of example, dielectric material 240 is oxide having a thickness ranging between approximately 5,000 Å and 15,000 Å. Openings are formed in oxide layer 240 to expose portions of silicide layers 232, 234, and 236. Using techniques well known to those skilled in the art, electrical conductors or electrodes are formed which contact the exposed silicide layers 232, 234, and 236. More particularly, a gate electrode 242 contacts gate silicide 232, a source electrode 244 contacts source silicide layer 234, and a drain electrode 246 contacts drain silicide layer 236. Accordingly, a semiconductor component 200 and a method of manufacturing the semiconductor component have been provided wherein a gate structure overlaps a source extension region but does not overlap a drain extension region and a source-side halo region is adjacent the source extension region.

By now it should be appreciated that an insulated gate semiconductor component and a method for manufacturing the semiconductor component have been provided. In accordance with one aspect of the present invention, the component has asymmetric source and drain extension regions, where the source extension region extends under the gate structure and the drain extension region is laterally spaced apart from the gate structure and does not extend under the gate structure. Forming the source extension region under the gate structure lowers the source resistance of the component, whereas forming the drain extension region to be spaced apart from the gate structure reduces the gate-to-drain tunneling current and improves the AC performance of the component by reducing the drain-side Miller Capacitance. In accordance with another aspect of the present invention, a source-side halo region is included to increase the mobility in the channel region and improve control of the threshold voltage roll-off.

Although certain preferred embodiments and methods have been disclosed herein, it will be apparent from the foregoing disclosure to those skilled in the art that variations and modifications of such embodiments and methods may be made without departing from the spirit and scope of the invention.

What is claimed is:

1. A method for manufacturing a semiconductor component, comprising:
   providing a semiconductor material of a first conductivity type having a major surface;
   forming a gate structure on the major surface, wherein the gate structure has first and second sides and a top surface, and wherein the gate structure does not include spacers;
   implanting a dopant of a second conductivity type into the semiconductor material to form first and second doped extension regions, wherein the implant forming the first and second doped extension regions is limited to a single angled implant that makes an angle of less than 90 degrees with respect to a direction perpendicular to the major surface, and wherein the first doped extension region is adjacent the first side of the gate structure and extends under the gate structure, and the second doped extension region is laterally spaced apart from the second side of the gate structure without implanted dopant underlying the second side of the gate structure so as to form an asymmetric dopant profile;
   forming first and second spacers adjacent the first and second sides of the gate structure, respectively; and
   forming first and second doped regions in the semiconductor material, the first and second doped regions being respectively source and drain regions and being continuous with the first and second doped extension regions, the first doped region aligned to the first spacer and the second doped region aligned to the second spacer.

2. The method of claim 1, wherein implanting the dopant into the semiconductor material includes implanting at an angle ranging between 0 degrees and 20 degrees.

3. The method of claim 1, wherein implanting the dopant into the semiconductor material includes implanting at an angle ranging between 0 degrees and 10 degrees.

4. The method of claim 1, wherein forming the first and second doped regions includes using a zero degree implant.

5. The method of claim 1, wherein forming the first and second doped regions includes using an implant having an angle of less than 10 degrees.

6. The method of claim 1, wherein forming the first and second spacers comprises depositing a layer of dielectric material over the gate structure and the major surface, and anisotropically etching the layer of dielectric material.

7. The method of claim 1, further including forming a halo region adjacent to the first doped region.

8. The method of claim 7, wherein the halo region is a source-side halo region comprising a dopant of the first conductivity type.

9. A method for manufacturing a semiconductor component, comprising:
   providing a semiconductor material of a first conductivity type having a major surface;
   forming a gate structure having first and second sides on the major surface, wherein the gate structure does not include spacers;
   forming first and second doped extension regions by implanting a dopant of a second conductivity type into the semiconductor material wherein the first and second doped extension regions are formed using only one angled implant that makes an angle between 0 degrees and 90 degrees with respect to a direction normal to the major surface, and wherein a portion of the first doped extension region extends under the gate structure and wherein the second doped extension region is laterally spaced apart from the second side of the gate structure such that implanted dopant does not underlie the gate structure so as to form an asymmetric dopant profile;
   forming a source region of the second conductivity type in the semiconductor material, the source region being continuous with the first doped extension region, the source region proximal to the first side of the gate structure; and
   forming a drain region of the second conductivity type in the semiconductor material, the drain region being continuous with the second doped extension region, the drain region proximal to the second side of the gate structure;
   depositing a layer of refractory metal on the source and drain regions, and heating the refractory metal to react with the source and drain regions so as to form silicides in the source and drain regions.

10. The method of claim 9, further including forming first and second spacers adjacent the first and second sides of the gate structure, respectively.

11. The method of claim 9, wherein implanting the dopant includes implanting the dopant at an angle ranging from 0 degrees to 20 degrees.

12. The method of claim 9, wherein implanting the dopant includes implanting the dopant at an angle less than 10 degrees.

13. The method of claim 9, wherein forming the source region and the drain region comprises implanting the dopant using a zero degree implant.

14. The method of claim 9, further including forming a halo region in the semiconductor material, the halo region adjacent at least one of the first and second doped extension regions.

15. The method of claim 14, wherein the halo region is a source-side halo region.

16. The method of claim 14, wherein the halo region is of the first conductivity type.

17. A method for manufacturing a semiconductor component comprising:
    providing a semiconductor material of a first conductivity type;
    forming a gate structure on the semiconductor material, wherein the gate structure has first and second sides and does not include spacers;
    using only one angled implant to form first and second doped regions, wherein the one angled implant comprises implanting a dopant of a second conductivity type into the semiconductor material, and wherein the one angled implant makes an angle of less than 90 degrees with respect to a direction substantially perpendicular to the major surface, and wherein a portion of the first doped region extends under the gate structure and wherein the second doped region is laterally spaced apart from the second side of the gate structure such that implanted dopant does not underlie the gate structure so as to form an asymmetric dopant profile;
    forming a first spacer proximal the first side of the gate structure and a second spacer proximal the second side of the gate structure;
    forming a third doped region in the semiconductor material, the third doped region aligned to the first spacer, and the third doped region being continuous with the first doped region; and
    forming a fourth doped region in the semiconductor material, the fourth doped region aligned to the second spacer, and the fourth doped region being continuous with the second doped region.

18. The method of claim 17, further including forming a fifth doped region, the fifth doped region of the first conductivity type and adjacent the first doped region.

19. The method of claim 17, wherein forming the first and second doped regions includes implanting at an angle ranging from 0 degrees to 20 degrees.

20. The method of claim 17, wherein forming the first and second doped regions includes implanting at an angle ranging between 0 degrees and 10 degrees.

* * * * *